United States Patent
Chang et al.

(10) Patent No.: US 12,284,778 B2
(45) Date of Patent: Apr. 22, 2025

(54) EXPANSION CARD POSITIONING MECHANISM AND SERVER

(71) Applicants: INVENTEC (PUDONG) TECHNOLOGY CORPORATION, Shanghai (CN); INVENTEC CORPORATION, Taipei (TW)

(72) Inventors: Siyuan Chang, Shanghai (CN); Gui-Jiao Zhang, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 222 days.

(21) Appl. No.: 18/128,171

(22) Filed: Mar. 29, 2023

(65) Prior Publication Data
US 2024/0306338 A1    Sep. 12, 2024

(30) Foreign Application Priority Data
Mar. 6, 2023 (CN) .......................... 202310209813.0

(51) Int. Cl.
*H05K 7/14* (2006.01)
(52) U.S. Cl.
CPC ................. *H05K 7/1489* (2013.01)
(58) Field of Classification Search
None
See application file for complete search history.

(56) References Cited

U.S. PATENT DOCUMENTS

| | | | | |
|---|---|---|---|---|
| 6,174,189 B1* | 1/2001 | Kuo | ..................... | H05K 7/1405 439/61 |
| 7,394,664 B1* | 7/2008 | Chang | ..................... | G06F 1/186 361/801 |
| 2011/0122569 A1* | 5/2011 | Chang | ..................... | G06F 1/186 361/759 |
| 2012/0127680 A1* | 5/2012 | Chiang | ................ | H05K 7/1408 248/220.21 |
| 2012/0134091 A1* | 5/2012 | Zhang | ..................... | G06F 1/186 361/679.32 |
| 2012/0147581 A1* | 6/2012 | Zhou | ....................... | G06F 1/186 361/801 |

* cited by examiner

*Primary Examiner* — James Wu
*Assistant Examiner* — Christopher L Augustin
(74) *Attorney, Agent, or Firm* — Maschoff Brennan (57) ABSTRACT

An expansion card positioning mechanism is configured to be disposed on a plate member. The expansion card positioning mechanism includes a movable member and a positioning member. The movable member includes a base portion and a first teeth portion. The base portion is configured to be slidably disposed on the plate member, and the first teeth portion is disposed on the base portion. The positioning member includes a plate portion, a positioning recess portion and a second teeth portion. The plate portion is rotatably disposed on a side of the base portion. The positioning recess portion and the second teeth portion are disposed on the plate portion. The second teeth portion meshes with the first teeth portion, so that the base portion forces the plate portion to rotate relative to the base portion via the first teeth portion and the second teeth portion meshing with each other.

10 Claims, 8 Drawing Sheets

EXPANSION CARD POSITIONING MECHANISM AND SERVER

CROSS-REFERENCE TO RELATED APPLICATIONS

This non-provisional application claims priority under 35 U.S.C. § 119(a) on Patent Application No(s). 202310209813.0 filed in China, on Mar. 6, 2023, the entire contents of which are hereby incorporated by reference.

BACKGROUND OF THE INVENTION

Technical Field of the Invention

The invention relates to an expansion card positioning mechanism, more particularly to an expansion card positioning mechanism disposed in a server.

Description of the Related Art

In a server, an expansion card has a plurality of purposes, such as image processing, network interface, peripheral device interface and data storage. Users may install the expansion card in the server according to their own needs so as to expand the function of the server.

When users need to install the expansion card to expand the functions of the server, the users may plug the expansion card into a slot of the server. In addition, in order to fix the expansion card in a casing of the server, generally, users may fasten the expansion card to the casing of the server via fasteners such as screws to further fix the expansion card after the expansion card is plugged into the slot. However, the aforementioned fixing means requires additional fasteners and fastening tools, which may increase procedures for installing the expansion card and is troublesome to install the expansion card for users. Therefore, how to simplify the process of installing the expansion card in the casing of the server is an important issue to be solved.

SUMMARY OF THE INVENTION

The invention provides an expansion card positioning mechanism and server which enable the process of installing the expansion card in the casing of the server to be simplified.

One embodiment of the invention provides an expansion card positioning mechanism configured to be disposed on a plate member. The expansion card positioning mechanism includes a movable member and a positioning member. The movable member includes a base portion and a first teeth portion. The base portion is configured to be slidably disposed on the plate member, and the first teeth portion is disposed on the base portion. The positioning member includes a plate portion, a positioning recess portion and a second teeth portion. The plate portion is rotatably disposed on a side of the base portion. The positioning recess portion and the second teeth portion are disposed on the plate portion. The second teeth portion meshes with the first teeth portion, so that the base portion forces the plate portion to rotate relative to the base portion via the first teeth portion and the second teeth portion meshing with each other.

Another embodiment of the invention provides a server including a casing, a motherboard, an expansion card and an expansion card positioning mechanism. The motherboard is disposed in the casing and having a slot. The expansion card is plugged into the slot, and one side of the expansion card is mounted on the casing. The expansion card positioning mechanism includes a movable member and a positioning member. The movable member includes a base portion and a first teeth portion. The base portion is slidably disposed on the casing, and the first teeth portion is disposed on the base portion. The positioning member includes a plate portion, a positioning recess portion and a second teeth portion. The plate portion is pivotally disposed at the casing and rotatably disposed on a side of the base portion. The positioning recess portion and the second teeth portion are disposed on the plate portion. The second teeth portion meshes with the first teeth portion, so that the base portion forces the plate portion to rotate relative to the base portion via the first teeth portion and the second teeth portion meshing with each other. Another side of the expansion card is positioned by the positioning recess portion.

According to the expansion card positioning mechanism and the server disclosed by above embodiments, since the movable member may force positioning member to rotate relative to the base portion via the first teeth portion and the second teeth portion meshing with each other, the positioning member may be engaged with and fix the expansion card or release the expansion card without mounting other fasteners additionally or using other auxiliary tools.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 1:
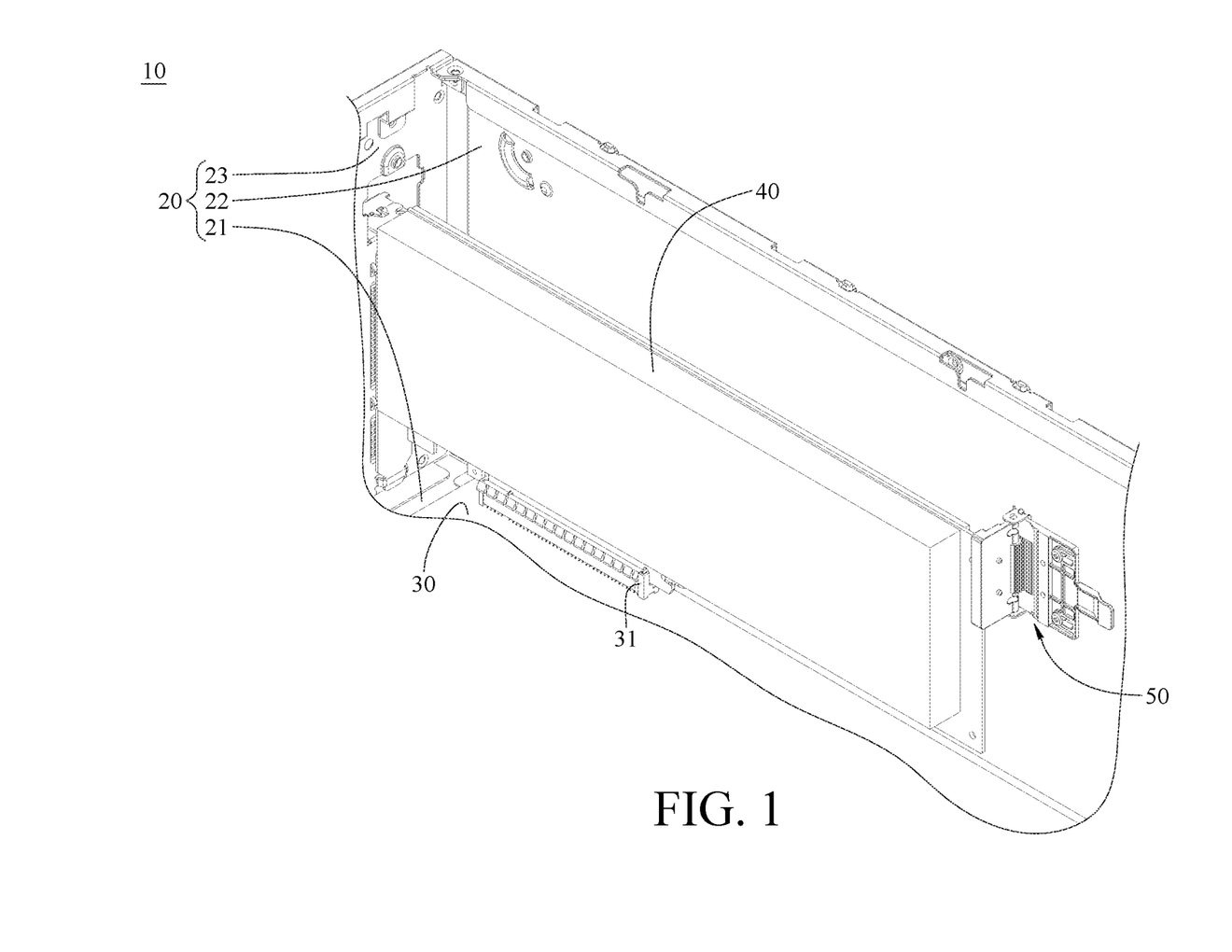
FIG. 1 is a partial perspective view of a server in accordance with one embodiment of the invention.
Figure 2:
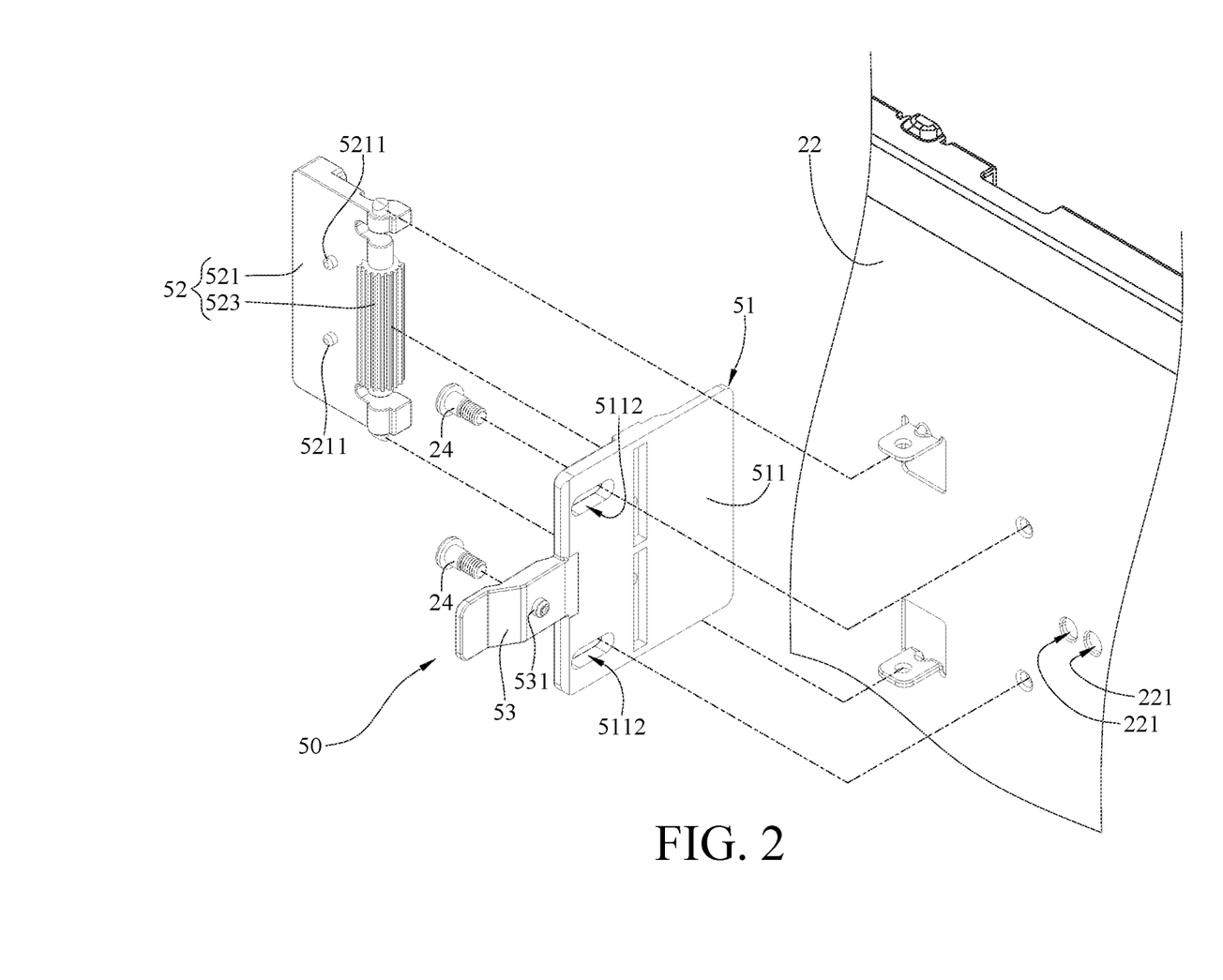
FIG. 2 is an exploded view of a casing and an expansion card positioning mechanism in FIG. 1.
Figure 3:
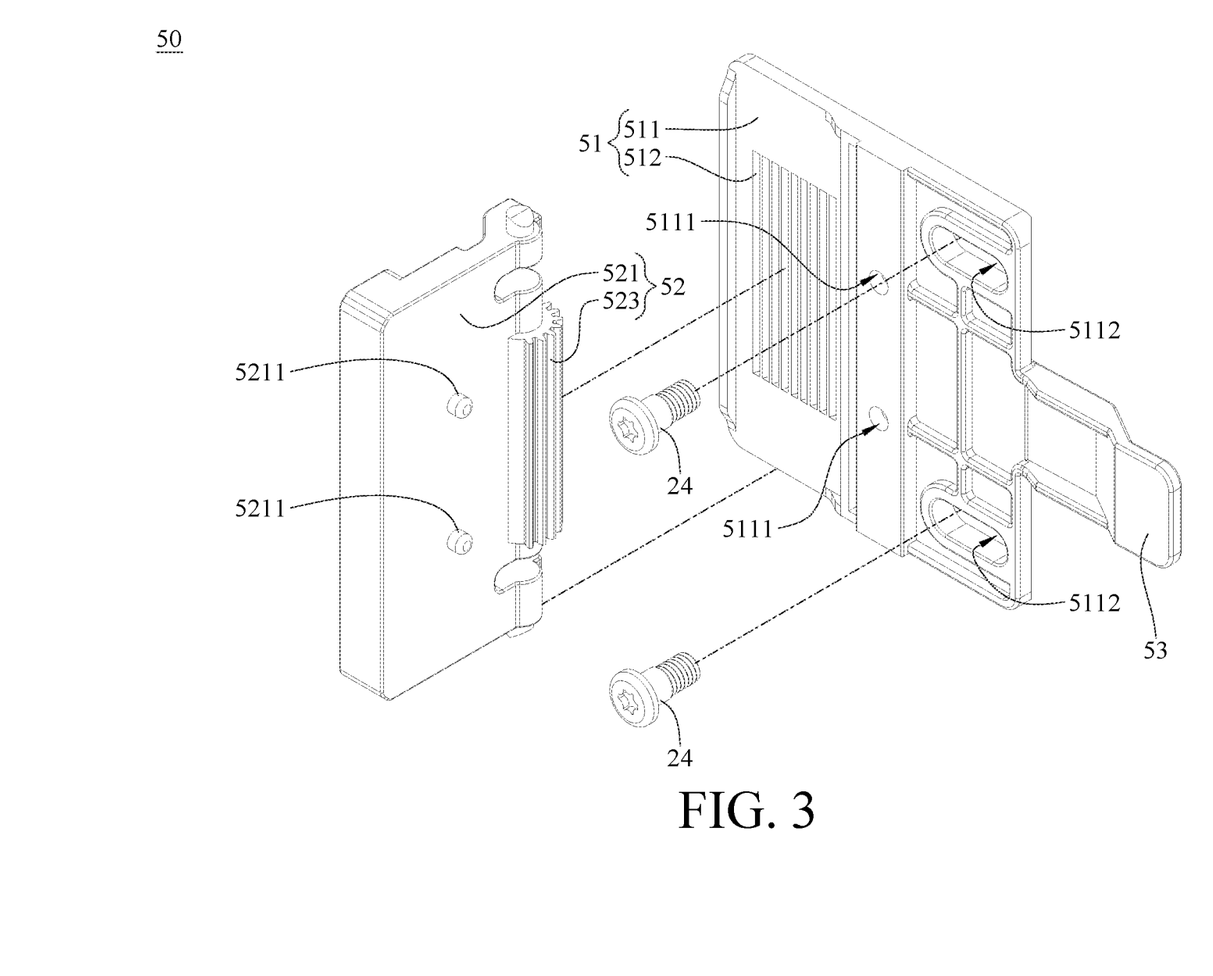
FIG. 3 is an exploded view of the expansion card positioning mechanism in FIG. 1.

Please refer to FIG. 1 to FIG. 3, where FIG. 1 is a partial perspective view of a server in accordance with an embodiment of the invention, FIG. 2 is an exploded view of a casing and an expansion card positioning mechanism in FIG. 1, and FIG. 3 is an exploded view of the expansion card positioning mechanism in FIG. 1.

In this embodiment, the server 10 includes a casing 20, a motherboard 30, an expansion card 40 and an expansion card positioning mechanism 50. The casing 20 includes a bottom plate 21, a first side plate 22, a second side plate 23 and two sliding blocks 24. The first side plate 22 is connected to one side of the bottom plate 21. The second side plate 23 is connected to another side of the first side plate 22. The two sliding blocks 24 are, for example, stepped screws, and are disposed on the first side plate 22. The motherboard 30 is disposed in the casing 20, and has a slot 31. The slot 31 is, for example, an expansion slot. The expansion card 40 is, for example, graphics card, and is plugged into the slot 31. One side of the expansion card 40 is mounted on the casing 20.

Figure 4:
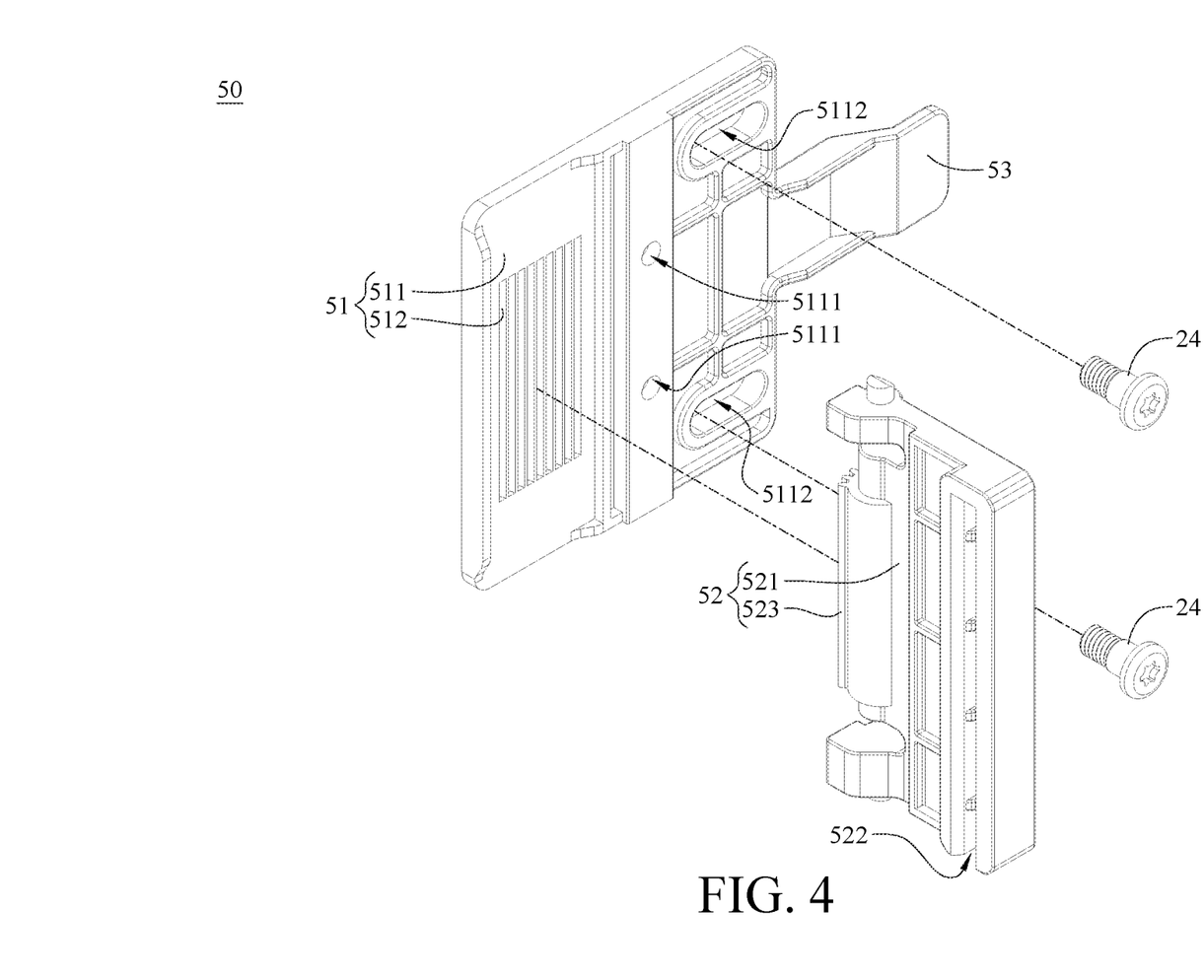
FIG. 4 is another exploded view of the expansion card positioning mechanism in FIG. 1.

Please refer to FIG. 4 together, which is another exploded view of the expansion card positioning mechanism in FIG. 1. The total thickness of the expansion card positioning mechanism 50 is, for example, 9 millimeters (mm). The expansion card positioning mechanism 50 includes a movable member 51, a positioning member 52 and an operating member 53. The movable member 51 includes a base portion 511 and a first teeth portion 512. The base portion 511 is slidably disposed on the casing 20, and has two sliding recesses 5112. The two sliding recesses 5112 of the base portion 511 are provided for the two sliding blocks 24 to be disposed thereon, respectively, so that the base portion 511 is slidable relative to the first side plate 22. The first teeth portion 512 is disposed on the base portion 511.

The positioning member 52 includes a plate portion 521, a positioning recess portion 522 and a second teeth portion 523. The plate portion 521 is pivotally disposed at the casing 20 and rotatably disposed on a side of the base portion 511. The positioning recess portion 522 and the second teeth portion 523 are disposed on the plate portion 521, and the second teeth portion 523 meshes with the first teeth portion 512, so that the base portion 511 can force the plate portion 521 to rotate relative to the base portion 511 via the first teeth portion 512 and the second teeth portion 523 meshing with each other. The expansion card 40 is engaged with the positioning recess portion 522, such that another side of the expansion card 40 is positioned by the positioning recess portion 522. That is, the plate portion 521 of the positioning member 52 rotates toward the expansion card 40 or toward the base portion 511 relative to the base portion 511 of the movable member 51 via the first teeth portion 512 and the second teeth portion 523 meshing with each other. When the plate portion 521 rotates toward the expansion card 40 relative to the base portion 511, the expansion card 40 is engaged with the positioning recess portion 522 of the positioning member 52, so that the expansion card 40 is positioned by the positioning recess portion 522, and it is unable to be moved relative to the positioning recess portion 522.

In addition, the base portion 511 has two mounting holes 5111. The plate portion 521 has two mounting pillars 5211. The two mounting pillars 5211 are tightly fitted into the two mounting holes 5111. That is, when the plate portion 521 of the positioning member 52 rotates toward the base portion 511 relative to the base portion 511 of the movable member 51 via the first teeth portion 512 and the second teeth portion 523 meshing with each other, the plate portion 521 is fixed to the base portion 511 by fitting the two mounting pillars 5211 into the two mounting pillars 5211

In this embodiment, the advantage that the plate portion 521 rotates relative to the base portion 511 via the first teeth portion 512 and the second teeth portion 523 meshing with each other is that the positioning member 52 may be engaged with or released from the expansion card 40 by rotating the plate portion 521 relative to the base portion 511 merely without additionally using other fasteners or other auxiliary tools to fix the expansion card 40. In addition, since the total thickness of the expansion card positioning mechanism 50 is 9 mm merely, the expansion card positioning mechanism 50 occupies a small space in the casing 20, so that the expansion card positioning mechanism 50 may not interfere with the installation of other components in the casing 20.

The operating member 53 is movably connected to the base portion 511 of the movable member 51. The first side plate 22, where the base portion 511 is disposed, has two positioning holes 221. Distances between each of the two positioning holes 221 and the second side plate 23 are different. The operating member 53 has a positioning pillar 531. The positioning pillar 531 of the operating member 53 is disposed in one of the two positioning holes 221. Accordingly, when the base portion 511 slides relative to the first side plate 22 to force the positioning member 52 to be engaged with or released from the expansion card 40 via the first teeth portion 512 and the second teeth portion 523, the operating member 53 can be positioned on the first side plate 22 by inserting the positioning pillar 531 into one of the two positioning holes 221.

In this embodiment, the casing 20 includes two sliding blocks 24, the base portion 511 has two sliding recesses 5112, and the two sliding blocks 24 are disposed in the two sliding recesses 5112, respectively, but the present invention is not limited thereto. In other embodiments, the casing may include one or more than two sliding blocks, the base portion may have one or more than two sliding recesses, and the sliding block(s) is (are) disposed in the sliding recess(es).

In this embodiment, the base portion 511 has two mounting holes 5111, the plate portion 521 includes two mounting pillars 5211, and the two mounting pillars 5211 are tightly fitted into the two mounting holes 5111, respectively, but the present invention is not limited thereto. In other embodiments, the base portion may have one or more than two mounting holes, the plate portion may include one or more than two mounting pillars, and the mounting pillar(s) is (are) tightly fitted into the mounting hole(s).

Figure 5:
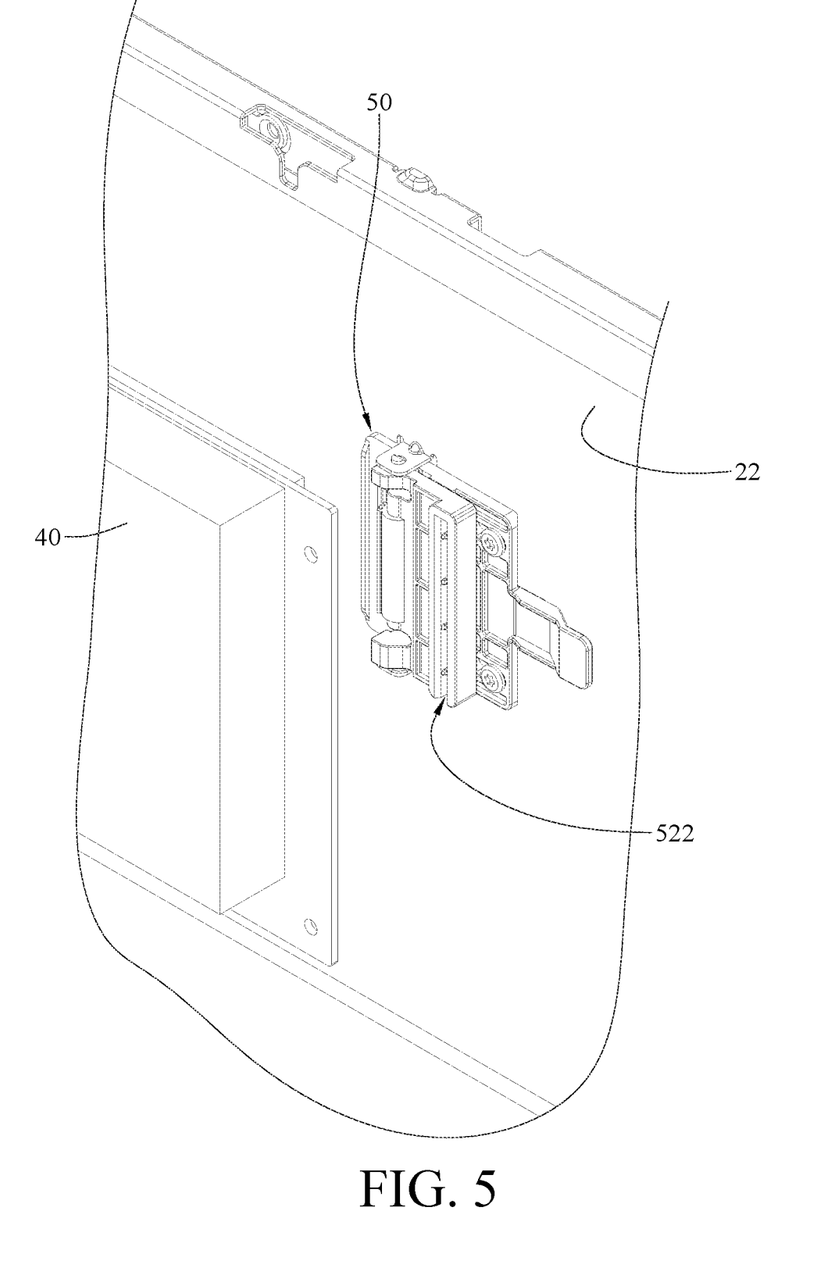
FIG. 5 is a partial perspective view of the server is FIG. 1 when the expansion card positioning mechanism is in a released state.
Figure 6:
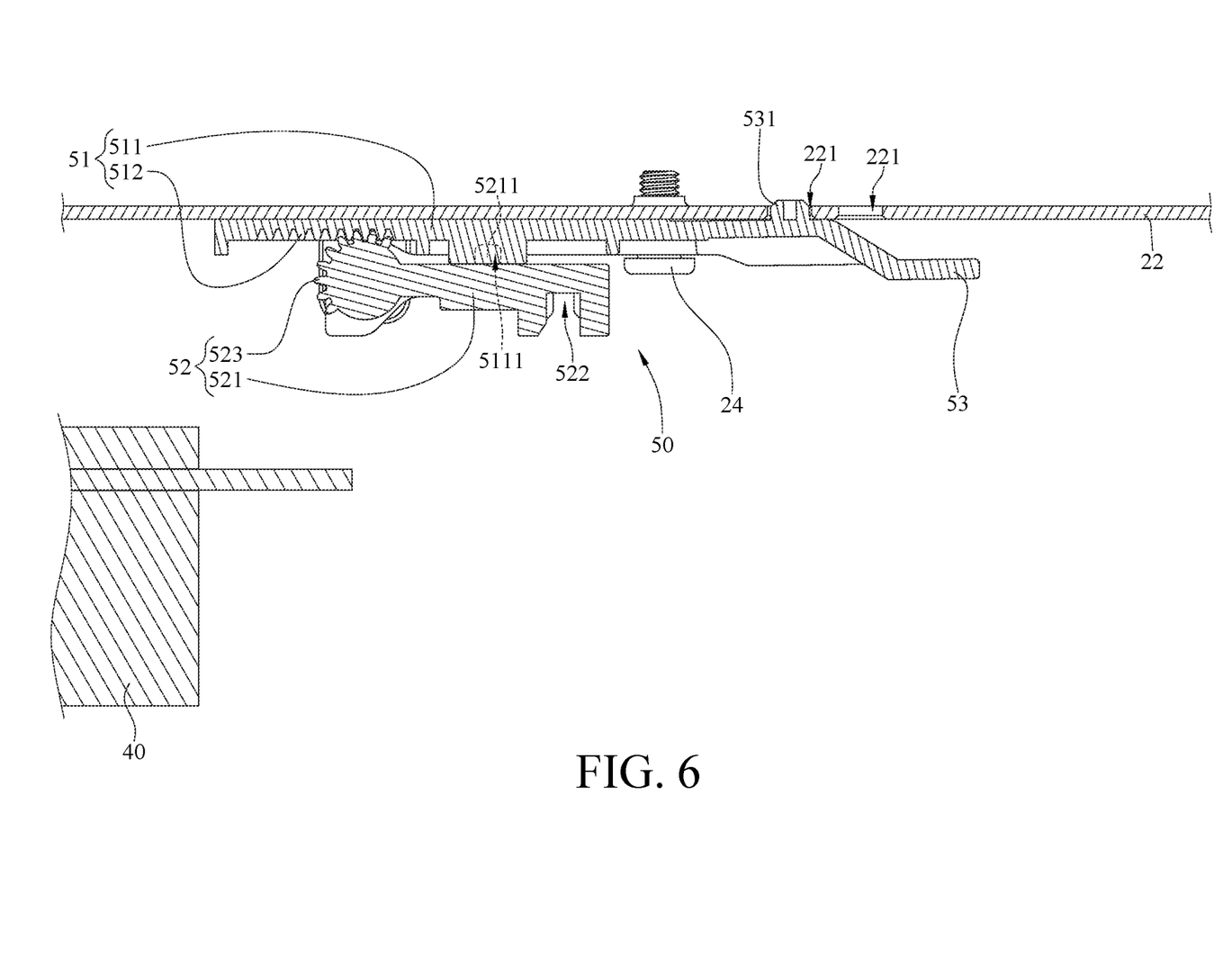
FIG. 6 is a partial cross-sectional view of the server in FIG. 1 when the expansion card positioning mechanism is in the released state.
Figure 7:
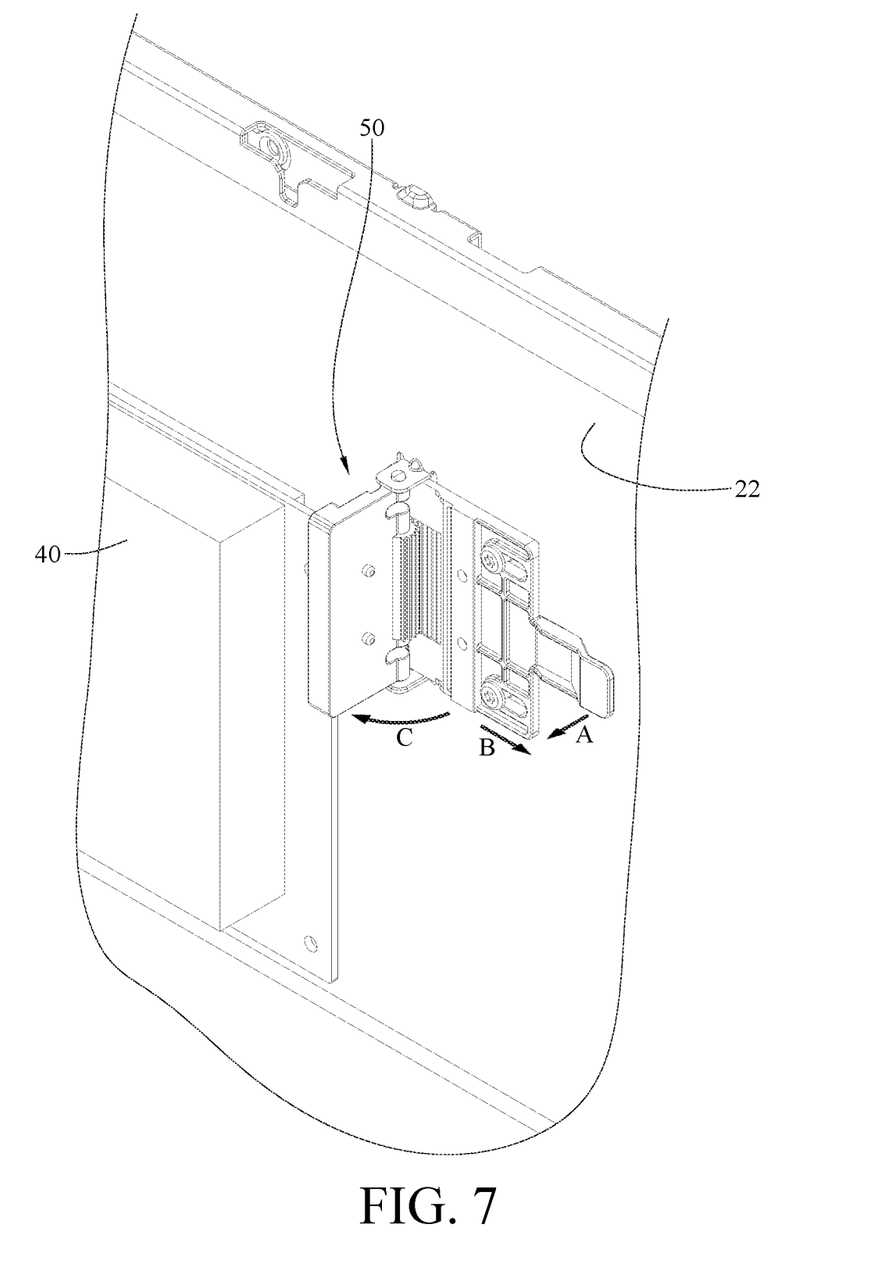
FIG. 7 is a partial perspective view of the server in FIG. 1 when the expansion card positioning mechanism is in an engaged state.
Figure 8:
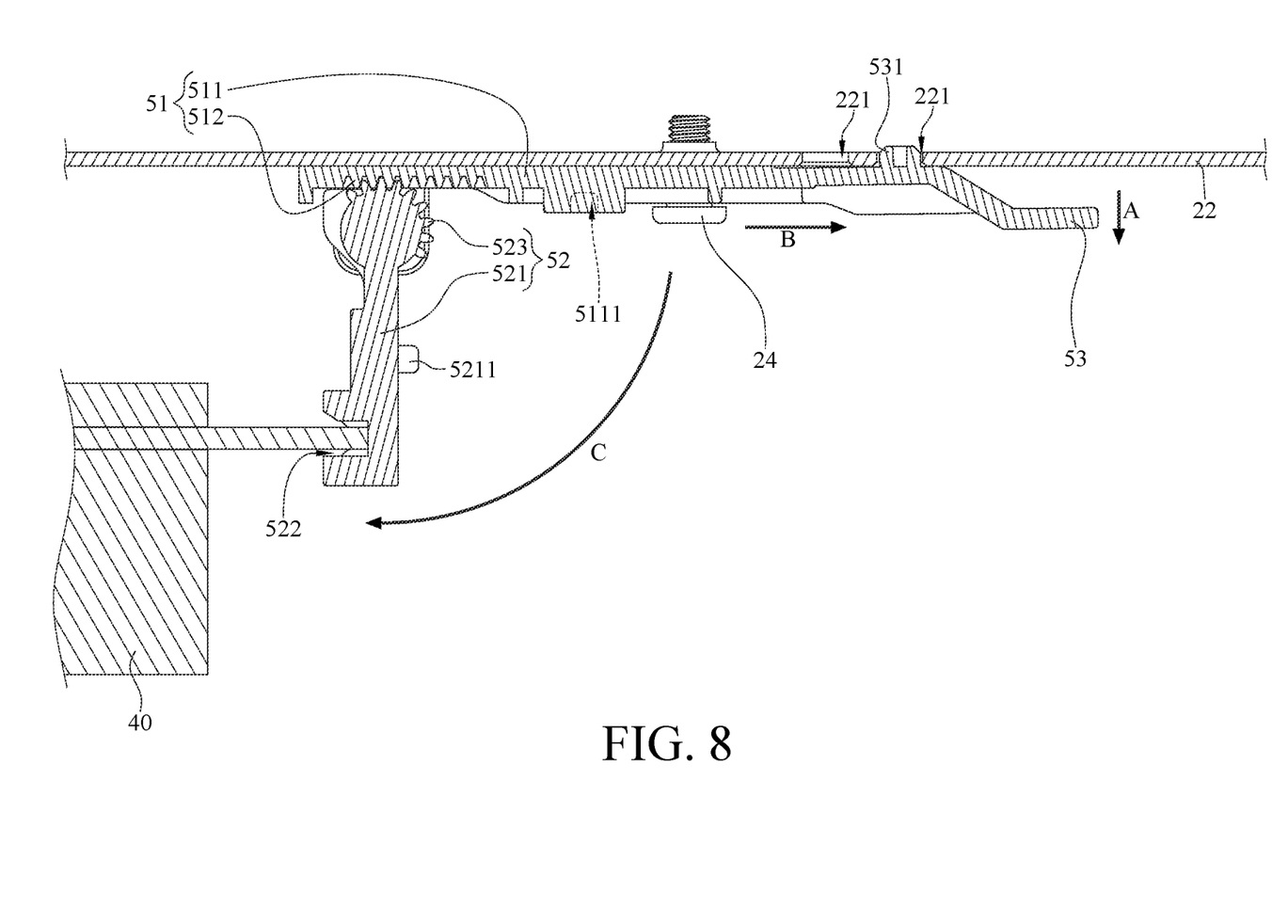
FIG. 8 is a partial cross-sectional view of the server in FIG. 1 when the expansion card positioning mechanism is in the engaged state.

Please refer to FIG. 5 to FIG. 7, where FIG. 5 is a partial perspective view of the server is FIG. 1 when the expansion card positioning mechanism is in a released state, FIG. 6 is a partial cross-sectional view of the server in FIG. 1 when the expansion card positioning mechanism is in the released state, FIG. 7 is a partial perspective view of the server in FIG. 1 when the expansion card positioning mechanism is in an engaged state, and FIG. 8 is a partial cross-sectional view of the server in FIG. 1 when the expansion card positioning mechanism is in the engaged state.

As shown in FIG. 5 and FIG. 6, the expansion card 40 is plugged into the slot 31 of the motherboard 30, and the expansion card positioning mechanism 50 is in the released state. The positioning member 52 is fixed to the movable member 51 by inserting the two mounting pillars 5211 into the two mounting holes 5111, respectively, and the positioning pillar 531 of the operating member 53 is mounted at the positioning hole 221 of the first side plate 22 which is located closer to the second side plate 23. Then, as shown in FIG. 7 and FIG. 8, the user disengages the two mounting pillars 5211 of the positioning member 52 from the two mounting holes 5111, and then pulls the operating member 53 along a direction A, so that the positioning pillar 531 is disengaged from the positioning hole 221, and the user slides the movable member 51 relative to the first side plate 22 along a direction B. Meanwhile, the movable member 51 forces the plate portion 521 to rotate toward the expansion card 40 relative to the base portion 511 along a direction C via the first teeth portion 512 and the second teeth portion 523 meshing with each other. Then, the user engages the expansion card 40 with the positioning recess portion 522 of the positioning member 52, and inserts the positioning pillar 531 into the positioning hole 221 which is located farther away from the second side plate 23 along a direction opposite to the direction A. At this time, the expansion card positioning mechanism 50 is changed from the released state to the engaged state. The expansion card 40 is positioned by the positioning recess portion 522, and is unable to be moved relative to the positioning recess portion 522, so as to strengthen the fixing strength of the expansion card 40 in the casing 20.

On the contrary, when the user needs to remove the expansion card 40 from the motherboard 30, firstly, the user disengages the positioning pillar 531 from the positioning hole 221 along a direction A, and slides the movable member 51 relative to the first side plate 22 along a direction opposite to the B. Meanwhile, the movable member 51 forces the plate portion 521 to rotate toward the base portion 511 relative to the base portion 511 along a direction opposite to C via the first teeth portion 512 and the second teeth portion 523 meshing with each other so as to disengage the expansion card 40 from the positioning recess portion 522. Then, the user inserts the positioning pillar 531 into the positioning hole 221 which is located closer to the second side plate 23 along a direction opposite to A, and inserts the two mounting pillars 5211 into the two mounting holes 5111, respectively, so that the positioning member 52 is fixed to the movable member 51. At this time, the expansion card positioning mechanism 50 is changed from the engaged state to the released state, and the expansion card 40 is not positioned by the positioning recess portion 522. Then, the user removes the expansion card 40 from the slot 31 of the motherboard 30 to complete the removal operation of the expansion card 40 from the motherboard 30.

According to the expansion card positioning mechanism and the server disclosed by above embodiments, since the movable member may force positioning member to rotate relative to the base portion via the first teeth portion and the second teeth portion meshing with each other, the positioning member may be engaged with and fix the expansion card or release the expansion card without mounting other fasteners additionally or using other auxiliary tools.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:
1. An expansion card positioning mechanism, configured to be disposed on a plate member, comprising:
a movable member, comprising a base portion and a first teeth portion, wherein the base portion is configured to be slidably disposed on the plate member, and the first teeth portion is disposed on the base portion; and
a positioning member, comprising a plate portion, a positioning recess portion and a second teeth portion, wherein the plate portion is rotatably disposed on a side of the base portion, the positioning recess portion and the second teeth portion are disposed on the plate portion, and the second teeth portion meshes with the first teeth portion, so that the base portion forces the plate portion to rotate relative to the base portion via the first teeth portion and the second teeth portion meshing with each other.

2. The expansion card positioning mechanism according to claim 1, wherein the base portion has a plurality of sliding recesses.

3. The expansion card positioning mechanism according to claim 1, wherein the base portion has at least one mounting hole, the plate portion has at least one mounting pillar, and the at least one mounting pillar is tightly fitted into the at least one mounting hole.

4. The expansion card positioning mechanism according to claim 1, further comprising an operating member, wherein the operating member is movably connected to the base portion of the movable member.

5. The expansion card positioning mechanism according to claim 4, wherein the operating member has a positioning pillar.

6. A server, comprising:
a casing;
a motherboard, disposed in the casing and having a slot;
an expansion card, plugged into the slot, wherein one side of the expansion card is mounted on the casing; and
an expansion card positioning mechanism, comprising:
a movable member, comprising a base portion and a first teeth portion, wherein the base portion is slidably disposed on the casing, and the first teeth portion is disposed on the base portion; and
a positioning member, comprising a plate portion, a positioning recess portion and a second teeth portion, wherein the plate portion is pivotally disposed at the casing and rotatably disposed on a side of the base portion, the positioning recess portion and the second teeth portion are disposed on the plate portion, the second teeth portion meshes with the first teeth portion, so that the base portion forces the plate portion to rotate relative to the base portion via the first teeth portion and the second teeth portion meshing with each other, and another side of the expansion card is positioned by the positioning recess portion.

7. The server according to claim 6, wherein the casing comprises a bottom plate, a first side plate, a second side plate and a plurality of sliding blocks, the first side plate is connected to one side of the bottom plate, the second side plate is connected to another side of the first side plate, the plurality of sliding blocks are disposed on the first side plate, the base portion has a plurality of sliding recesses, and the plurality of sliding recesses of the base portion are provided for the plurality of sliding blocks to disposed thereon, respectively, so that the base portion is slidable relative to the first side plate.

8. The server according to claim 7, wherein the expansion card positioning mechanism further comprises an operating member, the operating member is movably connected to the base portion of the movable member.

9. The server according to claim 8, wherein the first side plate, where the base portion is disposed, has two positioning holes, distances between each of the two positioning holes and the second side plate are different, the operating member has a positioning pillar, the positioning pillar of the operating member is disposed in one of the two positioning holes.

10. The server according to claim 6, wherein the base portion has at least one mounting hole, the plate portion has at least one mounting pillar, and the at least one mounting pillar is tightly fitted into the at least one mounting hole.

* * * * *